United States Patent
Morikawa

[11] Patent Number: 6,163,041
[45] Date of Patent: Dec. 19, 2000

[54] FIELD EFFECT TRANSISTOR AND METHOD OF MANUFACTURING THE SAME

[75] Inventor: Junko Morikawa, Tokyo, Japan

[73] Assignee: NEC Corporation, Tokyo, Japan

[21] Appl. No.: 09/049,713

[22] Filed: Mar. 27, 1998

[30] Foreign Application Priority Data

Mar. 27, 1997 [JP] Japan .................... 9-075283

[51] Int. Cl.$^7$ .................... H01L 29/778
[52] U.S. Cl. .................... 257/194; 257/192
[58] Field of Search .................... 257/192, 194

[56] References Cited

U.S. PATENT DOCUMENTS

| | | | |
|---|---|---|---|
| 4,236,166 | 11/1980 | Cho | 257/192 |
| 5,028,968 | 7/1991 | O'Loughlin | 257/194 |
| 5,300,795 | 4/1994 | Saunier | 257/192 |
| 5,343,056 | 8/1994 | Nakagawa | 257/194 |
| 5,381,027 | 1/1995 | Usagawa | 257/192 |
| 5,900,653 | 5/1999 | Suzuki | 257/194 |

FOREIGN PATENT DOCUMENTS

| | | |
|---|---|---|
| 62-15862 | 1/1987 | Japan . |
| 5-29356 | 2/1993 | Japan . |
| 6-151468 | 5/1994 | Japan . |
| 7-231002 | 8/1995 | Japan . |
| 8-97237 | 4/1996 | Japan . |
| 8-321600 | 12/1996 | Japan . |

OTHER PUBLICATIONS

Zhou, X., "Monte Carlo Formulation of Field–Dependent Mobility For $Al_xGa_{1-x}As$", *Solid–State Electronics*, 38:1264–66 (1995).

*Primary Examiner*—Jerome Jackson, Jr.
*Attorney, Agent, or Firm*—Hutchins, Wheeler & Dittmar

[57] ABSTRACT

A field effect transistor has a preselected build up resistance with respect to an I-V characteristic of the transistor. In this event, a first GaAs layer is formed on a GaAs substrate. Further, an AlGaAs layer is formed on the first GaAs layer and has a predetermined impurity concentration and a preselected Al composition ratio. Moreover, a gate electrode is placed on the AlGaAs layer to form a schottky contact with the AlGaAs layer. In addition, a second GaAs layers are arranged on both sides of the gate electrode via a recess and are formed on said AlGaAs layer. Finally, source and drain electrodes are formed on the second GaAs layers. With such a structure, the Al composition ratio is determined within a preselected range defined by a relationship between the impurity concentration and the build up resistance.

4 Claims, 10 Drawing Sheets

FIELD EFFECT TRANSISTOR AND METHOD OF MANUFACTURING THE SAME

BACKGROUND OF THE INVENTION

This invention relates to a field effect transistor (namely, FET), and in particular, a hetero-structure FET (namely, HFET) having an AlGaAs layer which forms a schottky contact with a gate electrode and manufacturing of the same.

Recently, it has been studied to adopt a hetero-structure in order to achieve a high breakdown voltage and to reduce a gate leak in an high output GaAs FET.

Generally, one stage of recesses or two stages of recesses are formed at a gate portion to increase the breakdown voltage and further to reduce a parastic resistance.

For instance, suggestion has been made about the FET having the two stages of recesses in Japanese Unexamined Patent Publication No. Hei. 8-97237. In this conventional example, an AlGaAs layer is arranged so as to serve as an etching stopper for an n-type GaAs active layer. Consequently, variation of a recess depth can be reduced.

The above FET will be manufactured by the following steps. A first n-type GaAs active layer, a first AlGaAs stopper layer, a second n-type GaAs active layer, a second AlGaAs stopper layer and a third n-type GaAs active layer are sequentially deposited on a GaAs substrate by the use of the known epitaxial growth process. Subsequently, a source electrode and a drain electrode are formed on the third n-type GaAs active layer by the use of photo-lithography and lift-off process.

Thereafter, an etching (selective recess etching) is selectively carried out for the third n-type GaAs active layer to form a wide recess. In this event, the etching is stopped by the second AlGaAs stopper layer.

Successively, the etching is selectively carried out for the second n-type GaAs active layer to form a narrow recess. In this event, the etching is stopped by the first AlGaAs stopper layer.

Subsequently, a gate electrode is formed on the first AlGaAs stopper layer in the narrow recess by the use of the vapor lift-off method. In this event, the gate electrode forms a schottky contact with the first AlGaAs stopper layer. Consequently, the variation due to the process of the recess shape is reduced in the above-mentioned FET.

In such a HFET, when the concentration of the AlGaAs layer (the first AlGaAs stopper layer) which forms the schottky contact with the gate electrode is higher or $5 \times 10^{17}$ cm$^{-3}$, the transistor or the device may be destroyed by an increase of a current density, and the breakdown voltage may be also reduced. On the other hand, it has been generally noticed that an Al composition ratio should be effectively increased to enhance an etching selectivity during etching the GaAs layer.

According to experiments of inventors, as the Al composition ratio of the second AlGaAS stopper layer is increased on the condition that the impurity concentration is kept constant, a build up resistance Ron which appears in an I-V characteristic of the HFET is rapidly increased.

Consequently, even when the Al composition ratio is slightly varied during the epitaxial growth process of the AlGaAs layer, the characteristic of the HFET (in particular, the DC characteristic) is largely fluctuated. Further, the RF characteristic of the HFET is also fluctuated by the increase of the build up resistance Ron.

SUMMARY OF THE INVENTION

It is therefore an object of this invention to provide a field effect transistor (FET) which is capable of realizing uniform and excellent DC and RF characteristics by preventing a rapid increase of a build up resistance of the FET.

It is another object of this invention to provide a method of manufacturing a field effect transistor (FET) which is capable of achieving an excellent etching selectivity during etching a GaAs layer.

According to this invention, a field effect transistor has a preselected build up resistance with respect to an I-V characteristic of the transistor. In this event, a first GaAs layer is formed on a GaAs substrate. Further, an AlGaAs layer is formed on the first GaAs layer and has a predetermined impurity concentration and a preselected Al composition ratio. Moreover, a gate electrode is placed on the AlGaAs layer to form a schottky contact with the AlGaAs layer. In addition, a second GaAs layers are arranged on both sides of the gate electrode via a recess and are formed on said AlGaAs layer. Finally, source and drain electrodes are formed on the second GaAs layers.

With such a structure, the Al composition ratio is determined within a preselected range defined by a relationship between the impurity concentration and the built up resistance. Specifically, the Al composition ratio is determined in accordance with the impurity concentration so as to prevent the increase of the build up resistance.

More specifically, the preselected range falls between a first composition ratio and a second composition ratio. Herein, the first composition ratio is substantially equal to 0.1 while the second composition ratio is specified when the build up resistance rapidly rises as the Al composition ratio is gradually increased.

Moreover, the impurity concentration falls within the range between $1 \times 10^{16}$ cm$^{-3}$ and $5 \times 10^{17}$ cm$^{-3}$. In this case, the impurity concentration is set to higher than $1 \times 10^{16}$ cm$^{-3}$ so as to substantially control the impurity concentration of the an AlGaAs layer while the impurity concentration is set to less than $5 \times 10^{17}$ cm$^{-3}$ in order to prevent deterioration of said transistor.

DESCRIPTION OF THE PREFERRED EMBODIMENTS

Figure 1:
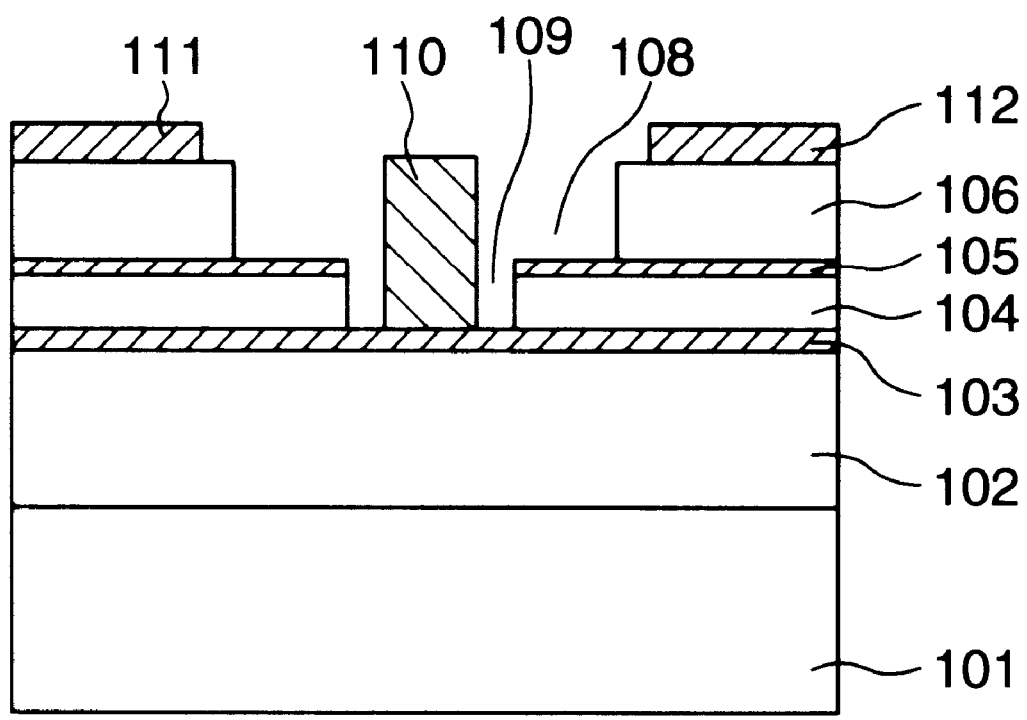
FIG. 1 is a cross sectional view of a conventional field effect transistor.

Referring to FIG. 1, a conventional field effect transistor (FET) will be first described for a better understanding of this invention. The FET is equivalent to the conventional FET mentioned in the preamble of the instant specification.

The conventional FET (disclosed in Japanese Unexamined Patent Publication No. Hei. 8-97237) will be manufactured by the following steps.

An n-type GaAs active layer 102, a AlGaAs stopper layer 103, an n-type GaAs active layer 104, an AlGaAs stopper layer 105 and an n-type GaAs active layer 106 are sequentially deposited on a GaAs substrate 101 by the use of the known epitaxial growth process.

Herein, the n-type GaAs active layer 102 falls within the range between 500 Å and 1500 Å while the AlGaAs stopper layer 103 falls within the range between 50 Å and 200 Å. Further, the n-type GaAs active layer 104 falls within the range between 450 Å and 800 Å while the AlGaAs stopper layer 105 falls within the range between 50 Å and 200 Å. Moreover, the n-type GaAs active layer 106 falls within the range between 950 Å and 2300 Å.

Subsequently, a source electrode 111 and a drain electrode 112 are formed on the n-type GaAs active layer 106 by the use of the known photolithography process and lift-off method.

Next, a resist pattern (not shown) having a desired opening diameter is formed to determine a width of a wider recess 108. Thereafter, a wet-etching (selective recess etching) is carried out for the active layer 106 by using the above resist pattern as a mask. In this event, the active layer 106 is selectively etched by using an etchant (for example, citric acid and hydrogen peroxide) which has a lower etching rate for the AlGaAs stopper layer 105. After the resist pattern is removed, another resist pattern (not shown) for forming a gate electrode 110 is formed in the wider recess 108.

Subsequently, an anisotropic etching is carried out for the AlGaAs stopper layer 105 by using the above resist pattern as a mask to expose the n-type GaAs active layer 104. Further, the recess etching is selectively performed for the n-type GaAs active layer 104 by the use of an etchant which has a lower etching rate for the AlGaAs stopper layer 103. Thereafter, the gate electrode 110 is formed by the use of the known vapor lift-off method by using the resist pattern as a mask.

Successively, the gate electrode 110 is formed on the AlGaAs stopper layer 103 in a narrower recess 109 by removing the resist pattern. Thereby, the variation due to the process of the recess shape is reduced in the above-mentioned FET, as mentioned before.

In such a FET (HFET), when the impurity concentration of the AlGaAs layer 103 which forms a schottky contact with the gate electrode 110 is $5 \times 10^{17}$ cm$^{-3}$ or higher, the transistor or the device may be destroyed by an increase of a current density. Further, the breakdown voltage is also reduced. On the other hand, it has been generally noticed that an Al composition ratio is effectively increased to improve the etching selectivity during etching the GaAs active layer.

Figure 2:
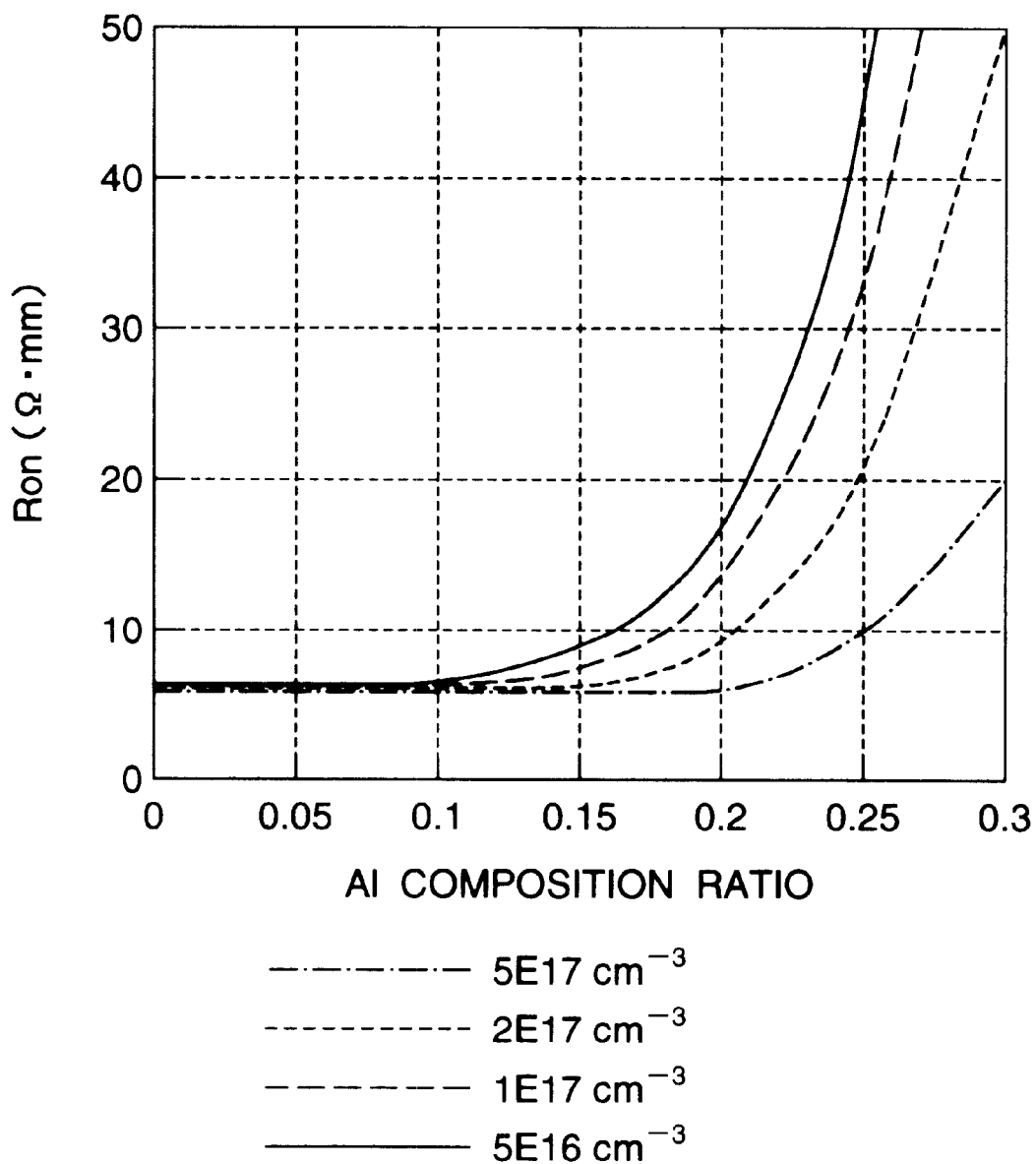
FIG. 2 is a graph showing a relation between an Al composition ratio and a build up resistance Ron using impurity concentration as parameters in a conventional field effect transistor.

It has been confirmed from an experimental result that a build up resistance Ron which appears in an I-V characteristic (FIG. 3) of the HFET is rapidly increased when the Al composition ratio is gradually increased on the condition that the impurity concentration is kept constant, as illustrated in FIG. 2. In this event, 5E17 cm$^{-3}$, 2E17 cm$^{-3}$, 1E17 cm$^{-3}$, and 5E16 cm$^{-3}$ are used as parameters of the impurity concentration in FIG. 2, respectively.

Figure 3:
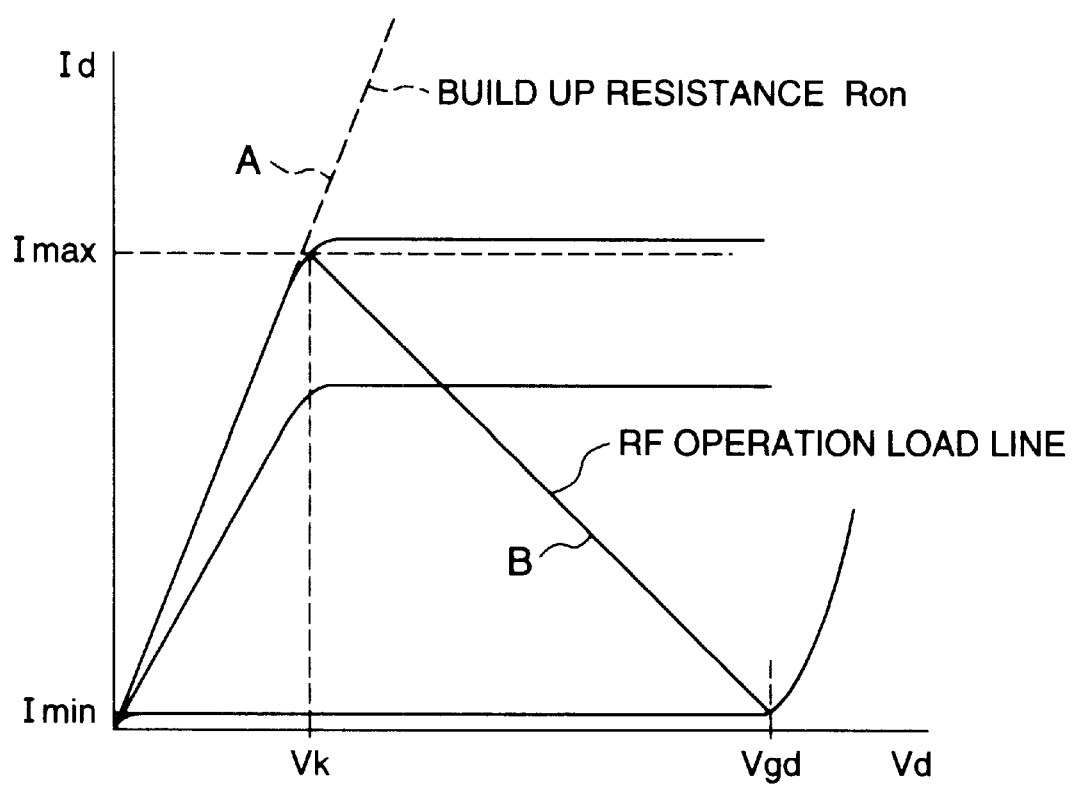
FIG. 3 is a graph showing an I-V curve (an I-V characteristic) and a load line of a conventional field effect transistor.

Herein, the build up resistance Ron (reference numeral A) is represented by Ron=$\Delta$Ids/$\Delta$Vds at Vds=0V, Vg=0V, as shown in FIG. 3. In this event, the reference numeral B represents a load line of a RF operation in FIG. 3. Consequently, when the Al composition ratio is slightly varied during the epitaxial growth of the AlGaAs layer 103, the characteristic of the FET (in particular, the DC characteristic) is largely fluctuated.

In this event, a saturation output power Pout, a maximum drain efficiency $\eta_D$ are represented by the following formulas.

$$Pout=2(Imax-Imin)(Vgd-Vk)/\pi$$

$$\eta_D=(Imax-Imin)(Vgd-Vk)/2(Imax+Imin)(Vgd+Vk)$$

As the build up resistance Ron is increased, Vk is also increased. However, when Vk is increased, both the saturation output power Pout and the maximum drain efficiency $\eta_D$ are degraded. Namely, the RF characteristic of the FET is also fluctuated by the increase of the build up resistance Ron.

Taking the above mentioned problems into consideration, this invention provides the FET or the HFET which is capable of obtaining uniform and excellent DC and RF characteristics by preventing the increase of the build up resistance Ron of the FET or the HFET.

(First embodiment)

Figure 4:
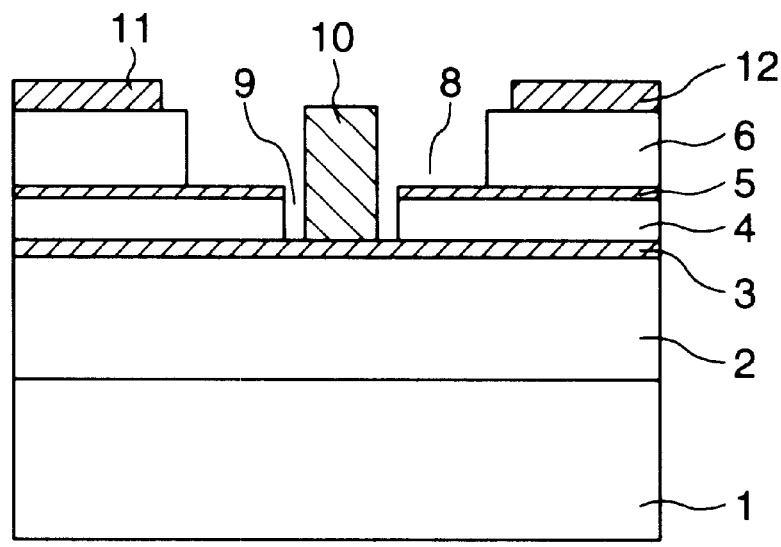
FIG. 4 is a cross sectional view of a field effect transistor according to a first embodiment of this invention.

Referring to FIG. 4, description will be made about a FET according to a first embodiment of this invention.

As shown in FIG. 4, an n-type GaAs layer 2, an n-type AlGaAs layer 3, an n-type GaAs layer 4, an n-type AlGaAs layer 5 and an n-type GaAs layer 6 are sequentially deposited on a GaAs substrate 1 by the use of the known epitaxial growth process. In this event, the n-type GaAs layer 6 is partially removed to form a wider recess 8 on the n-type AlGaAs layer 5. On the other hand, the n-type AlGaAs layer 5 and the n-type GaAs layer 4 are partially removed to form a narrower recess 9. A gate electrode 10 which forms a schottky contact with the n-type AlGaAs layer 3 is placed in the narrower recess 9. Finally, a source electrode 11 and a drain electrode 12 each of which forms an ohmic contact with the n-type GaAs layer 6 are placed thereon.

Figure 8:
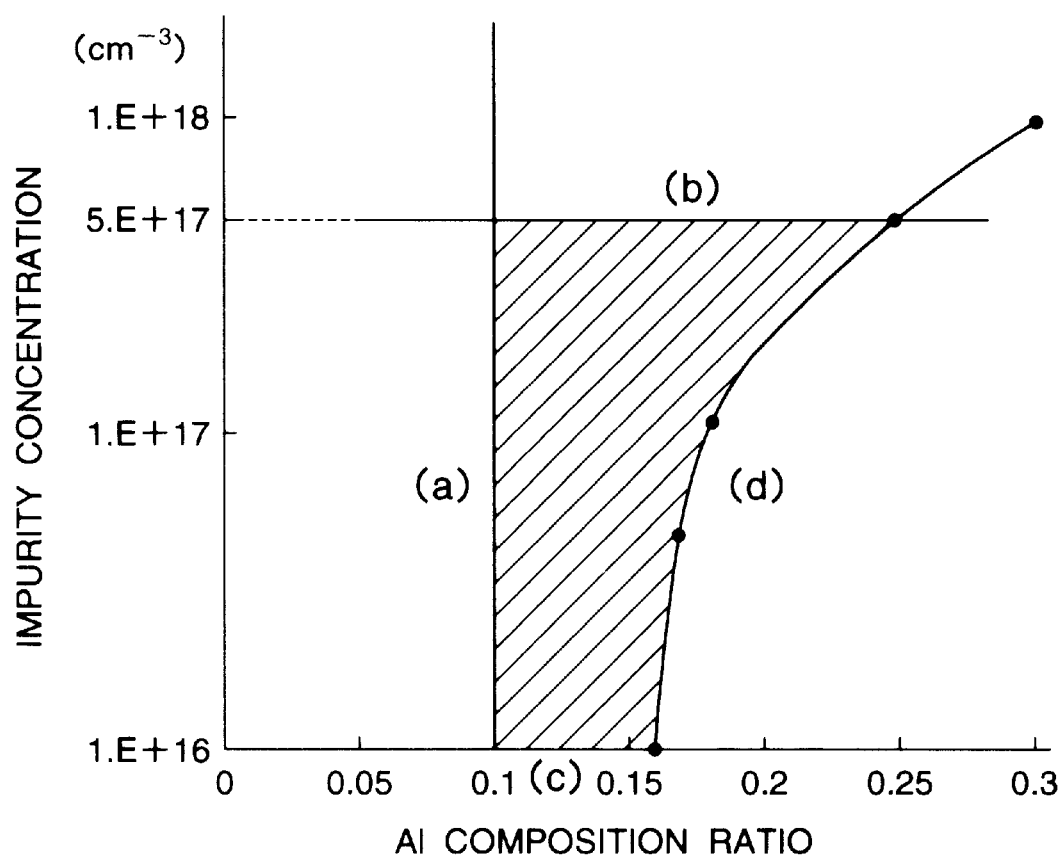
FIG. 8 is another graph showing a relation between an Al composition ratio and an impurity concentration according to this invention.

Herein, it is to be noted that an Al composition ratio and an impurity concentration of the n-type AlGaAs layer 3 fall within the region surrounded by an oblique line illustrated in FIG. 8.

In this event, detail description will be made about reasons for which the Al composition ratio and the impurity concentration restrictively belong to above-mentioned region.

Namely, the increase of the build up resistance Ron is suppressed by suitably selecting the Al composition ratio in accordance with the impurity concentration. Further, it is preferable that the impurity concentration falls within the range between $1 \times 10^{16}$ cm$^{-3}$ and $5 \times 10^{17}$ cm$^{-3}$. When the impurity concentration is smaller than $1 \times 10^{16}$ cm$^{-3}$, it is impossible to substantially control the impurity concentration. On the other hand, when the impurity concentration is higher than $5 \times 10^{17}$ cm$^{-3}$, the FET or the device may be degraded or destroyed.

Figure 6:
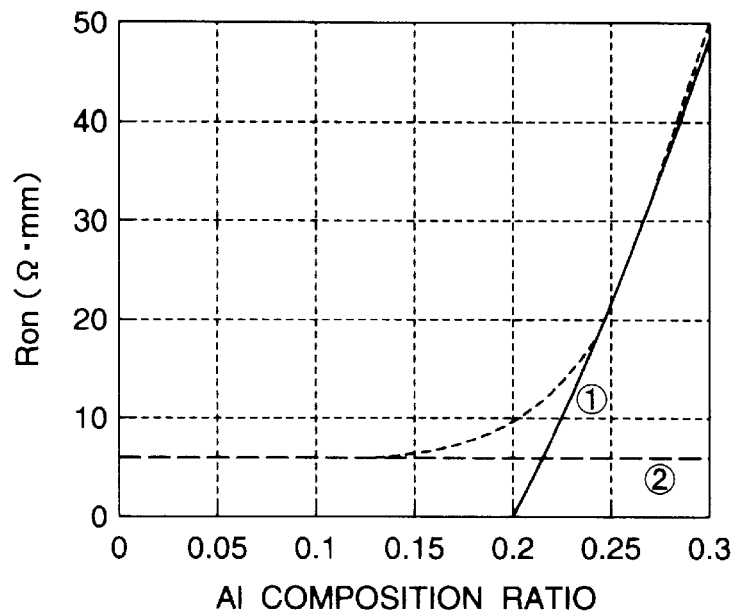
FIG. 6 is a graph showing a relation between an Al composition ratio and a build up resistance Ron according to this invention.

More specifically, the AlGaAs layer 3 which forms the schottky contact with the gate electrode 10 has the impurity concentration of, for example, $2.0 \times 10^{17}$ cm$^{-3}$ in FIG. 6. In this event, the build up resistance Ron of the transistor (FET) is rapidly increased when the Al composition exceeds 0.2, as illustrated in FIG. 6.

Herein, the Al composition ratio is 0.21 at an intersection between a line ① for connecting two points in the rising portion and the build up resistance Ron ② of the Al composition ratio 0. Under this circumstances, the Al composition ratio is determined so that the composition ratio is not exceeding 0.2. In this event, the composition ratio (0.2) is obtained by subtracting the composition variation (0.01) during the epitaxial growth process from the above composition range (0.21).

Thereby, the increase of the build up resistance Ron can be suppressed so as to reduce the variation of the characteristic of the FET even when the composition variation during the epitaxial growth process is taken into account.

In this event, each of maximum Al composition ratios has been determined to prevent the increase of the rising resistance Ron by carrying out the above same method for the following impurity concentration, as represented by Table 1.

TABLE 1

| IMPURITY CONCENTRATION | A1 COMPOSITION RATIO |
|---|---|
| $1 \times 10^{16}$ cm$^{-3}$ | 0.16 |
| $5 \times 10^{16}$ cm$^{-3}$ | 0.17 |
| $1 \times 10^{17}$ cm$^{-3}$ | 0.18 |
| $5 \times 10^{17}$ cm$^{-3}$ | 0.25 |
| $1 \times 10^{17}$ cm$^{-3}$ | 0.30 |

Figure 7:
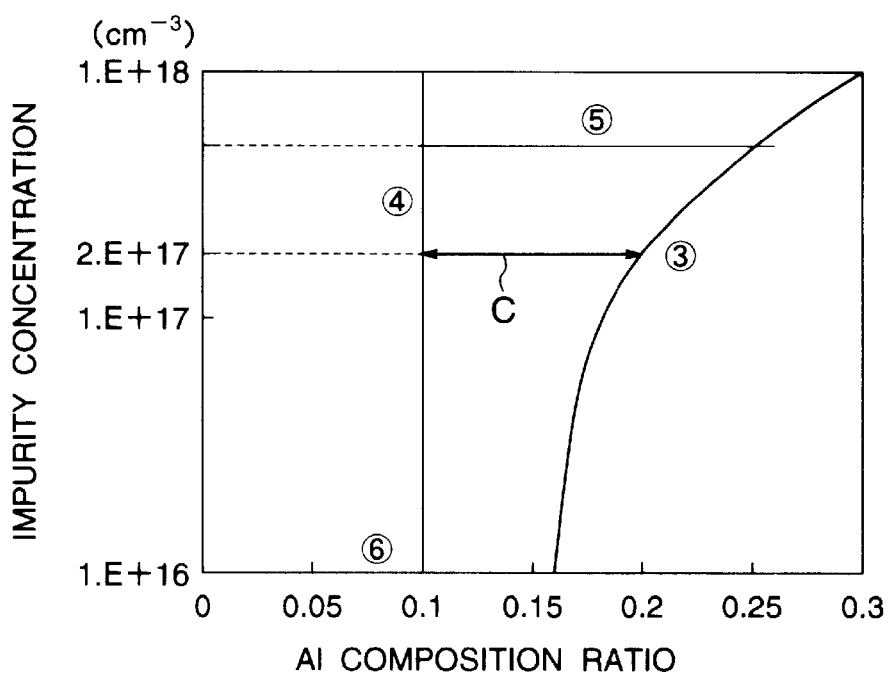
FIG. 7 is a graph showing a relation between an Al composition ratio and an impurity concentration according to this invention.

Herein, a curve ③ illustrated in FIG. 7 is obtained by connecting the above points in Table 1. The composition ratios in the lefthand side of the curve ③ is preferable or suitable for the respective impurity concentration. Further, the Al composition ratios are preferably or suitably positioned in the righthand side of a line ④ because the Al composition ratio must be 0.1 or higher from the viewpoint of the etching selectivity during the selective etching process.

Moreover, the impurity concentration belongs to the region which is surrounded by the line ⑤ ($5 \times 10^{17}$ cm$^{-3}$) and the line ⑥ ($1 \times 10^{16}$ cm$^{-3}$), as illustrated in FIG. 7. This is because it is impossible to substantially control the impurity concentration when the impurity concentration is smaller than $1 \times 10^{16}$ cm$^{-3}$ while the transistor or the device may be degraded or destroyed when the impurity concentration is higher than $5 \times 10^{17}$ cm$^{-3}$, as mentioned before. For instance, the desirable or suitable range of the Al composition ratio at the impurity composition of $2 \times 10^{17}$ cm$^{-3}$ is indicated by an arrow C in FIG. 7.

From the above-mentioned result, the range or region of the Al composition ratio and the impurity concentration which should satisfy is represented by the oblique portion in FIG. 8.

This oblique portion illustrated in FIG. 8 is the region which is surrounded by the following lines (a), (b) and (c) and a curve (d).

(a) a line which is specified by the composition ratio of 0.1, (b) a line which is specified by the impurity concentration of $5 \times 10^{17}$ cm$^{-3}$, (c) a line which is specified by the impurity concentration of $1 \times 10^{16}$ cm$^{-3}$, (d) a curve for smoothly connecting four points of ① (the impurity concentration of $1 \times 10^{16}$ cm$^{-3}$ at the Al composition ratio of 0.16), ② (the impurity concentration of $5 \times 10^{16}$ cm$^{-3}$ at the Al composition ratio of 0.17), ③ (the impurity concentration of $1 \times 10^{17}$ cm$^{-3}$ at the Al composition ratio of 0.18), and ④ (the impurity concentration $5 \times 10^{17}$ cm$^{-3}$ at the Al composition ratio of 0.25).

(Second embodiment)

Subsequently, description will be made about a method of manufacturing the FET of the first embodiment illustrated in FIG. 4, referring to FIGS. 9 through 13.

First, the n-type GaAs layer 2 having an impurity concentration of $2 \times 10^{17}$ cm$^{-3}$ is deposited to a film thickness of 1000 Å on the GaAS substrate 1 by the use of the known molecular beam epitaxy (MBE). Further, the n-type AlGaAs layer 3 having the impurity concentration of $2 \times 10^{17}$ cm$^{-3}$ is deposited to the film thickness of 200 Å thereon. Herein, although the Al composition ratio of the n-type AlGaAs layer 3 falls within the range between 0.1 and 0.2 as illustrated in FIG. 8, the Al composition ratio is selected to 0.18 (namely, Al$_{0.18}$Ga$_{0.82}$As) in this example.

Successively, the n-type GaAs layer 4 having the impurity concentration of $2 \times 10^{17}$ cm$^{-3}$ is deposited to the film thickness of 500 thereon. Further, the n-type AlGaAs layer 5 having the impurity concentration of $2 \times 10^{17}$ cm$^{-3}$ and the Al composition ratio of 0.25 is deposited to the film thickness of 50 Å thereon. Moreover, the n-type GaAs layer 6 having having the impurity concentration of $5 \times 10^{17}$ cm$^{-3}$ is deposited to the film thickness of 1000 Å thereon. In this event, each deposition is carried out by the use of the known epitaxial growth process. Further, Si is used as a dopant of each of the n-type GaAs layers 2, 4 and 6 and the n-type AlGaAs layer 3 and 5.

Figure 9:
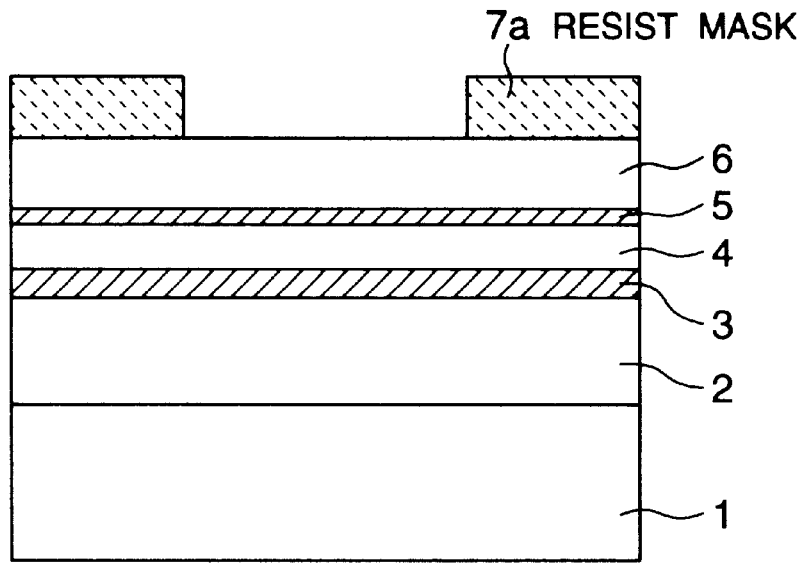
FIG. 9 is a cross sectional view showing a step for manufacturing the field effect transistor illustrated in FIG. 4 according to a third embodiment.

Thereafter, a photoresist (not shown) is applied to form a first wide recess as shown in FIG. 9. Further, the exposure and the development are carried out to form a resist mask 7a having an opening of 3.0 μm width.

Figure 10:
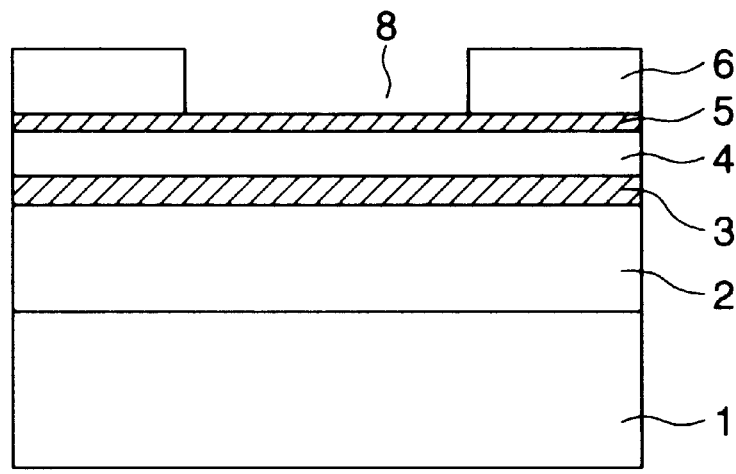
FIG. 10 is a cross sectional view showing another step for manufacturing the field effect transistor illustrated in FIG. 4 according to a third embodiment.

Subsequently, the n-type GaAs layer 6 is etched to form the recess 8 by the use of the dry-etching. In this event, the dry etching is performed by the known electron cyclotron resonance (ECR) which BCl$_3$/SF$_6$ is used as a reactive gas, as illustrated in FIG. 10. In this event, the etching is carried out by using the resist mask 7a as a mask and the n-type AlGaAs layer 5 as the stopper.

Figure 11:
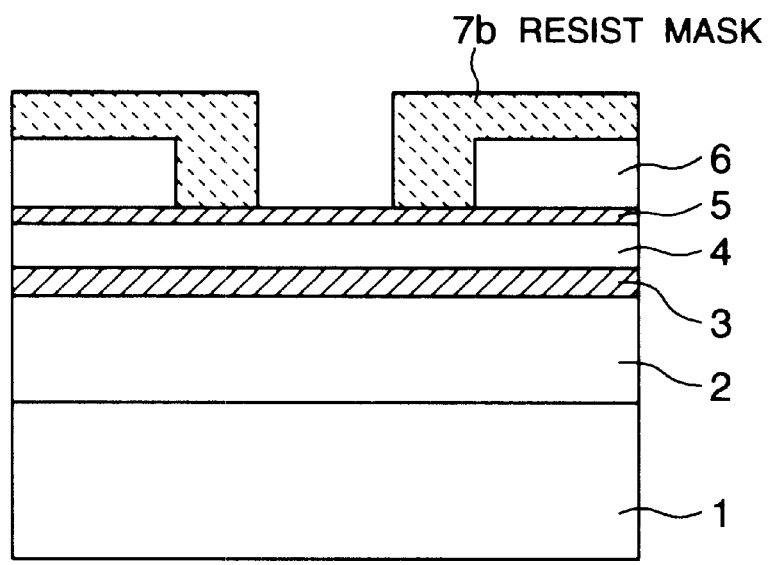
FIG. 11 is a cross sectional view showing another step for manufacturing the field effect transistor illustrated in FIG. 4 according to a third embodiment.

Next, the resist mask 7a is removed as shown in FIG. 10. Successively, another resist mask 7b is formed by the use of the application of the photoresist, the exposure and the development, as shown in FIG. 11. In this event, the resist mask 7b has an opening of a gate recess shape.

Figure 12:
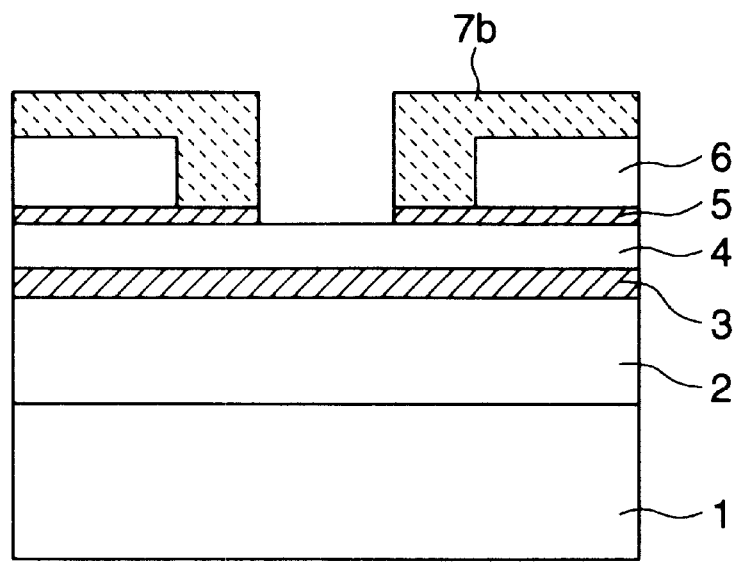
FIG. 12 is a cross sectional view showing another step for manufacturing the field effect transistor illustrated in FIG. 4 according to a third embodiment.

Subsequently, the n-type AlGaAs layer 5 which is not covered with the resist mask 7b is partially removed by the wet-etching by using a phosphoric acid based-etchant to expose the surface of the n-type GaAs layer 4, as illustrated in FIG. 12.

Figure 13:
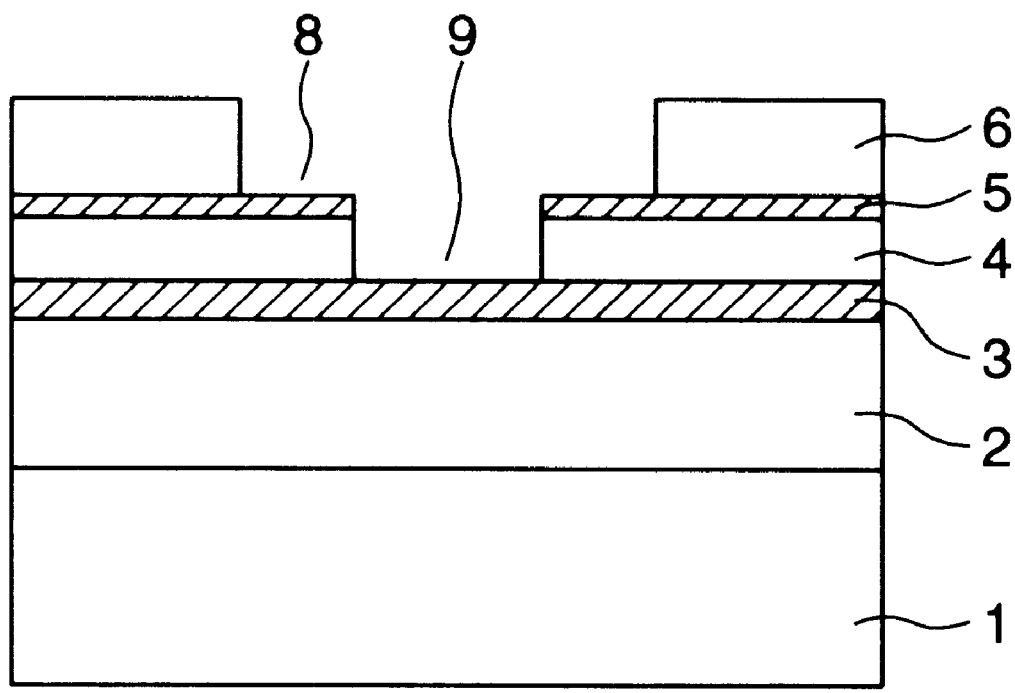
FIG. 13 is a cross sectional view showing another step for manufacturing the field effect transistor illustrated in FIG. 4 according to a third embodiment.

Successively, the n-type GaAs layer 4 is selectively removed or etched by the use of the known ECR dry-etching process to remain a narrow recess 9 (namely, gate recess) by using the n-type AlGaAs layer 3 as the stopper, as shown in FIG. 13. Thereafter, the resist mask 7b is removed.

Subsequently, a resist pattern is formed and thereafter, the gate electrode 10 (FIG. 4) is formed by the use of the Al deposition and the lift-off method. Further, the source electrode 11 and the drain electrode 12 are formed on the n-type GaAs layer 6, illustrated in FIG. 4. In this case, each of the source electrode 11 and the drain electrode 12 may be formed by AuGeNi/Au. Thus, the FET illustrated in FIG. 4 is completed.

In such a HFET, the variation of the threshold voltage Vt is excessively low, namely 80 mV or less at σ value. Further, the HFET can obtain excellent DC/RF characteristic.

(Third embodiment)

Subsequently, description will be made about a FET according to a third embodiment of this invention, referring to FIG. 5.

Figure 5:
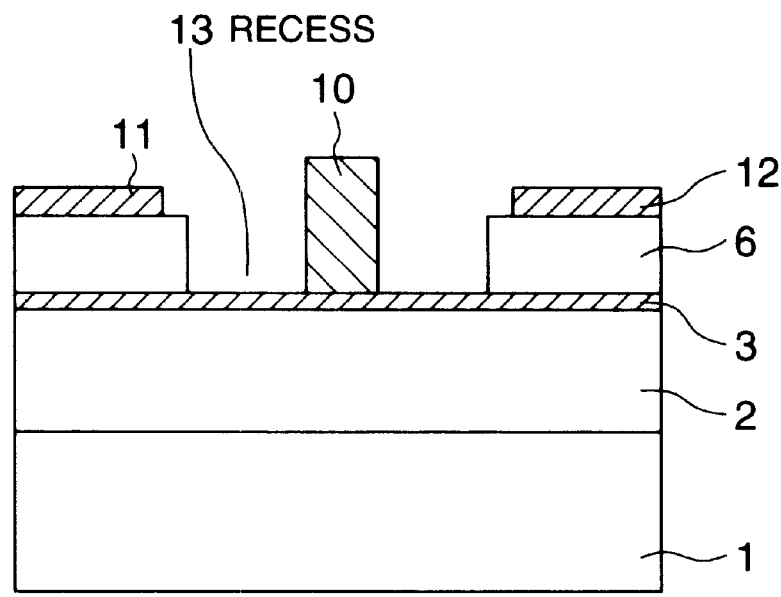
FIG. 5 is a cross sectional view of a field effect transistor according to a second embodiment of this invention.

As shown in FIG. 5, a n-type GaAs layer 2, an n-type AlGaAs layer 3 and an n-type GaAs layer 6 are sequentially deposited on a GaAs substrate 1 by the use of the known epitaxial growth process. The n-type GaAs layer 6 is partially removed to form a recess 13 on the n-type AlGaAS layer. A gate electrode 10 which forms a schottky contact with the n-type AlGaAs layer 3 is placed in the recess 13. Further, a source electrode 11 and a drain electrode 12 are arrange on the n-type GaAs layer 6 to obtain an ohmic contact.

Herein, it is to be noted that the Al composition ratio and the impurity concentration of the n-type AlGaAs layer 3 fall within the region surrounded by the oblique line illustrated in FIG. 8, like the first embodiment.

As mentioned before, this oblique portion in FIG. 8 is the region which is surrounded by the following lines and the curve.

(a) the line which is specified by the composition ratio of 0.1, (b) the line which is specified by the impurity concentration of $5\times10^{17}$ cm$^{-3}$, (c) the line which is specified by the impurity concentration of $1\times10^{16}$ cm$^{-3}$, (d) the curve for smoothly connecting four points of ① (the impurity concentration of $1\times10^{16}$ cm$^{-3}$ at the Al composition ratio of 0.16), ② (the impurity concentration of $5\times10^{16}$ cm$^{-3}$ at the Al composition ratio of 0.17), ③ (the impurity concentration of $1\times10^{17}$ cm$^{-3}$ at the Al composition ratio of 0.18), and ④ (the impurity concentration $5\times10^{17}$ cm$^{-3}$ at the Al composition ratio of 0.25).

(Fourth embodiment)

Figure 14:
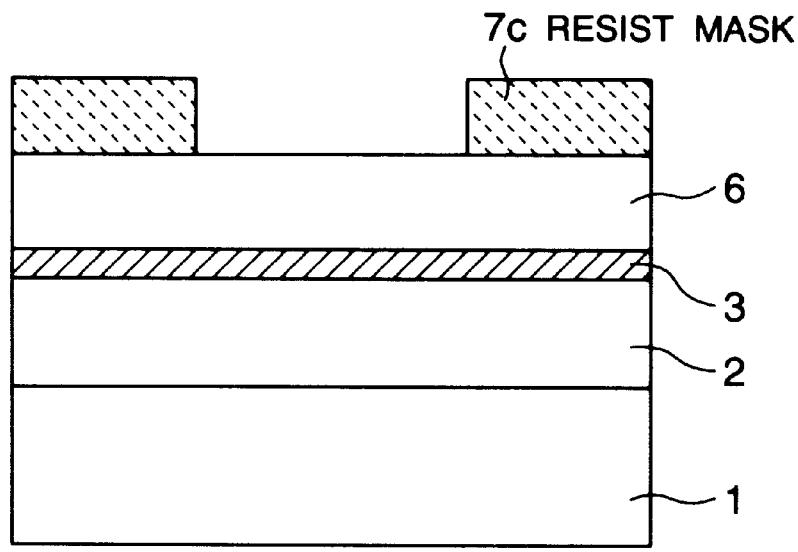
FIG. 14 is a cross sectional view showing a step for manufacturing the field effect transistor illustrated in FIG. 5 according to a fourth embodiment.
Figure 15:
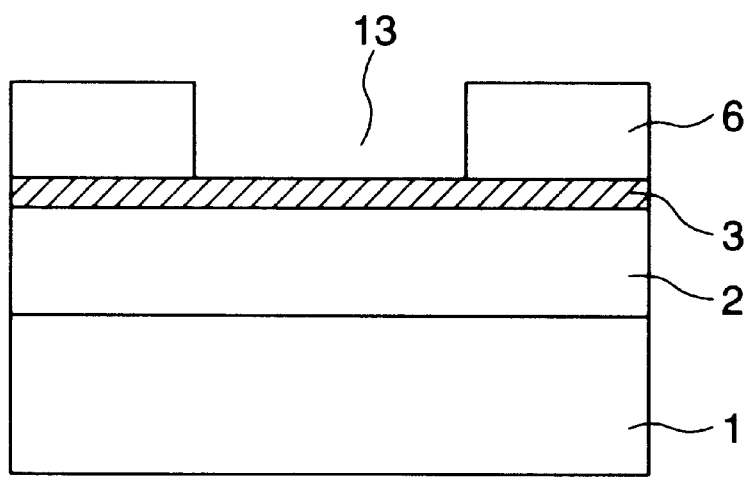
FIG. 15 is a cross sectional view showing another step for manufacturing the field effect transistor illustrated in FIG. 5 according to a fourth embodiment.

Referring to FIGS. 14 and 15, description will be made about a method of manufacturing the FET according to the third embodiment illustrated in FIG. 5.

First, the n-type GaAs layer 2 having the impurity concentration of $2\times10^{17}$ cm$^{-3}$ is deposited to the film thickness of 1500 Å by the use of the MBE method on the GaAs substrate 1. Thereafter, the n-type AlGaAs layer 3 having the impurity concentration of $2\times10^{17}$ cm$^{-3}$ and the Al composition ratio of 0.15 is deposited to the film thickness of 200 Å thereon. Further, the n-type GaAs layer 6 having the impurity concentration of $5\times10^{17}$ cm$^{-3}$ is deposited to the film thickness of 1000 Å thereon. Thereafter, a resist mask 7c having an opening of a recess shape is formed to structure the recess by the use of the application of the photoresist, the exposure and the development, as illustrated in FIG. 14.

Subsequently, the n-type GaAs layer 6 is etched to form the recess 13 by the use of the ECR dry-etching process like the second embodiment. In this event, the etching is carried out by using the resist mask 7c as the mask and the n-type AlGaAs layer 3 as the stopper. Thereafter, the resist mask 7c is removed, as illustrated in FIG. 15.

Next, the gate electrode 10, the source electrode 11 and the drain electrode 12 are formed by the use of the lift-off method. Thus, the HFET illustrated in FIG. 5 is completed.

Such a HFET can obtain a lower characteristic variation and the excellent DC/RF characteristic.

Although the epitaxial growth process is carried out by the use of the MBE method in the above-mentioned embodiments, the metal organic chemical vapor deposition (MOCVD) method may be alternatively used.

Further, although the selective etching of the GaAs layer is carried out by the use of the ECR dry-etching process, the etching may be alternatively performed by the use of the reactive ion etching (RIE) without the electron cyclotron resonance. Instead, the n-type AlGaAs layer 5 may be etched by the dry method instead of the wet method.

What is claimed is:

1. A field effect transistor, comprising:

a first GaAs layer which is formed on a GaAs substrate;

an AlGaAs layer which is formed on said first GaAs layer and which has a predetermined impurity concentration and a preselected Al composition ratio;

a gate electrode which is placed on said AlGaAs layer to form a schottky contact with said AlGaAs layer;

second GaAs layers which are arranged on both sides of said gate electrode via a recess and which are formed on said AlGaAs layer; and source and drain electrodes which are formed on said second GaAs layers;

the Al composition ratio and the impurity concentration falling within the range surrounded by the following lines (a), (b) and (c) and a curve (d) in a graph showing a relation between the Al composition ratio and the impurity concentration, wherein:

(a) a line which is specified by the composition ratio of 0.1;

(b) a line which is specified by the impurity concentration $5\times10^{17}$ cm$^{-3}$;

(c) a line which is specified by the impurity concentration of $1\times10^{16}$ cm$^{-3}$;

(d) a curve for smoothly connecting four points of the impurity concentration of $1\times10^{16}$ cm$^{-3}$ at the Al composition ratio of 0.16, the impurity concentration of $5\times10^{16}$ cm$^{-3}$ at the Al composition ratio of 0.17, the impurity concentration of $1\times10^{17}$ cm$^{-3}$ at the Al composition ratio of 0.18, and the impurity concentration of $5\times10^{17}$ cm$^{-3}$ at the Al composition ratio of 0.25.

2. A transistor as claimed in claim 1, wherein:

the transistor has a build up resistance with respect to an I-V characteristic of the transistor, and the Al composition ratio is determined in accordance with the impurity concentration so as to prevent an increase of the build up resistance.

3. A field effect transistor, comprising:

a first GaAs layer which is formed on a GaAs substrate;

a first AlGaAs layer which is formed on said first GaAs layer and which has a predetermined impurity concentration and a preselected Al composition ratio;

a gate electrode which is placed on said first AlGaAs layer to form a schottky contact with said first AlGaAs layer;

second GaAs layers which are arranged on both sides of said gate electrode via a first recess and which are formed on said first AlGaAs layer; and second AlGaAs layers which are formed on said second GaAs layers;

third GaAs layers which are formed on said second AlGaAs layers via a second recess; and source and drain electrodes which are formed on said third GaAs layers;

the Al composition ratio and the impurity concentration falling within the range surrounded by the following lines (a), (b), (c) and a curve (d) in a graph showing a relation between the Al composition ratio and the impurity concentration, wherein:

(a) a line which is specified by the composition ratio of 0.1;

(b) a line which is specified by the impurity concentration of $5 \times 10^{17}$ cm$^{-3}$;

(c) a line which is specified by the impurity concentration of $1 \times 10^{16}$ cm$^{-3}$ (d) a curve for smoothly connecting four points of the impurity concentration of $1 \times 10^{16}$ cm$^{-3}$ at the Al composition ratio of 0.16, the impurity concentration of $5 \times 10^{16}$ cm$^{-3}$ at the Al composition ratio of 0.17, the impurity concentration of $1 \times 10^{17}$ cm$^{-3}$ at the Al composition ratio of 0.18, and the impurity concentration of $5 \times 10^{17}$ cm$^{-3}$ at the Al composition ratio of 0.25.

4. A transistor as in claim 3, wherein:

the transistor has a build up resistance with respect to an I-V characteristic of the transistor, and the Al composition is determined in accordance with the impurity concentration so as to prevent an increase in the build up resistance.

* * * * *